United States Patent [19]

Alton et al.

[11] Patent Number: 5,408,693
[45] Date of Patent: Apr. 18, 1995

[54] MUTING OF RADIO-TRANSMITTER DIGITAL AUDIO BASED ON RECEIVED SIGNAL STRENGTH

[75] Inventors: Kenneth D. Alton, Coral Springs; Ronald E. Sharp, Plantation; Mark S. Stuglik, Margate; David L. Brown, Miami, all of Fla.

[73] Assignee: Motorola, Inc., Schaumburg, Ill.

[21] Appl. No.: 812,994

[22] Filed: Dec. 24, 1991

[51] Int. Cl.⁶ .............................................. H04B 1/16
[52] U.S. Cl. .................................. 455/212; 455/221; 455/226.2; 375/351
[58] Field of Search ............... 455/212, 213, 218, 220, 455/221, 222, 226.2, 35.1, 38.1; 375/99, 104

[56] References Cited

U.S. PATENT DOCUMENTS

| | | | |
|---|---|---|---|
| 4,430,742 | 2/1984 | Milleker et al. | 375/104 |
| 4,630,290 | 12/1986 | Kage | 375/104 |
| 4,761,829 | 8/1988 | Lynh, Jr. et al. | 455/213 |
| 4,922,549 | 5/1990 | Johnson et al. | 455/212 |
| 5,193,210 | 3/1993 | Nicholas et al. | 455/38.1 |

FOREIGN PATENT DOCUMENTS 0046155 3/1985 Japan .................................. 375/104

Primary Examiner—Reinhard J. Eisenzopf
Assistant Examiner—Chi Pham
Attorney, Agent, or Firm—Michael J. Buchenhorner; Pedro P. Hernandez

[57] ABSTRACT

A radio communication device (10) comprises a radio transceiver (12), having a received signal strength indicator (RSSI) (16), an audio section (22), and a controller (16) for deactivating the audio section whenever the RSSI indicates the the received signal strength is below a predetermined threshold. The controller also operates as a counter (26) for indicating the length of time that the received signal strength has been below the predetermined threshold.

8 Claims, 3 Drawing Sheets

MUTING OF RADIO-TRANSMITTER DIGITAL AUDIO BASED ON RECEIVED SIGNAL STRENGTH

TECHNICAL FIELD

This invention relates generally to radio communication equipment, and more specifically to digital radio telephone communication.

BACKGROUND

When sending digitized voice signals on radio waves, approaching the limits of the radio frequency (RF) range, the audio quality of the voice signals degrades, but unlike an analog system which gets ever-increasing background noise, a digital system will produce loud "pops" and "noise bursts" in a user's ear. The audio quality will still be extremely good with the exceptions of a these few "noise bursts" out to the limit of the receiver's sensitivity. However, when that limit is reached, digital synchronization will be lost and a continuous blast of very loud noise is produced. This noise is of maximum amplitude because it is produced by random data being applied to the digital audio recovery circuitry producing the widest possible swing in the amplitude of the audio circuit. The noise burst problem is present in second generation cordless telephone (CT2) systems. Thus, a need exists for a radio communication device that solves the problems caused by errors in recovered digitized voice systems.

SUMMARY OF THE INVENTION

Briefly, according to the invention, a digital radio communication device comprises a radio receiver for receiving radio signals comprising digital information, a received signal strength indicator (RSSI) for producing an RSSI signal indicative of the level of the radio signals received by the radio receiver, an audio section for producing output reconstructed audio signals representing the estimate of the original analog signal, and an attenuator for attenuating the output audio signals whenever the RSSI indicates that the received signal strength is below a predetermined threshold for a predetermined period of time.

DETAILED DESCRIPTION OF THE PREFERRED EMBODIMENT

Figure 1:
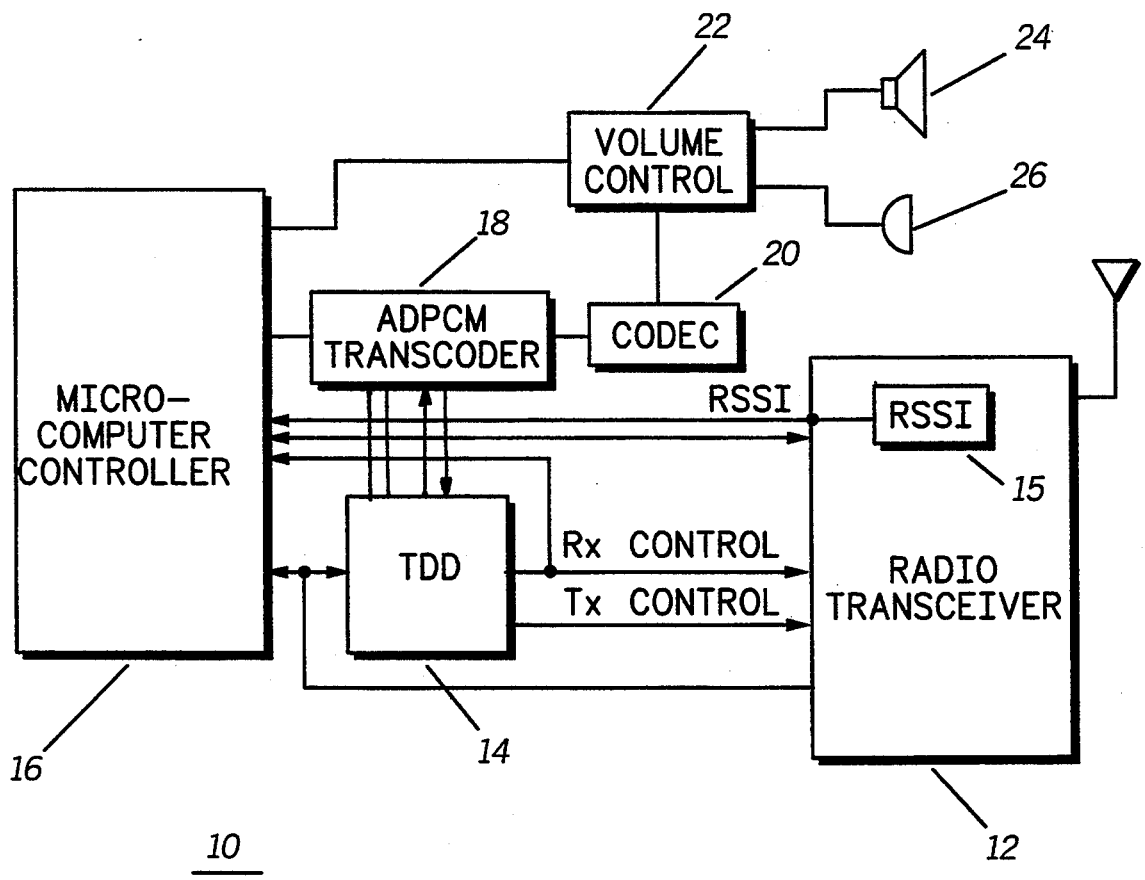
FIG. 1 is a simplified block diagram of a radio telephone handset in accordance with the invention.

Referring to FIG. 1, there is shown a simplified block diagram of a radio telephone handset 10, in accordance with the invention. The handset 10 is preferably a CT2 handset which includes a radio transceiver 12 coupled to a time-division duplexer 14 and to a microcomputer controller 16. The radio transceiver 12 operates as both receiver and transmitter means during alternating receive and transmit modes, respectively. The handset 10 also includes an adaptive differential pulse code modulator (ADPCM) transcoder 18, and a coder/decoder (CODEC) 20 which operate in a manner governed by the well-known CT2 Common Air Interface (CAI). An audio volume control section 22 is used to control audio from both voice signals received from a user via a microphone 26, and decoded audio signals from the CODEC 20, at least part of which may be presented to a user via a speaker 24.

In the receive mode, the transceiver receives radio signals containing adaptive differential pulse code modulated (ADPCM) information. The transcoder 18 decodes received ADPCM signals and provides pulse-code modulated (PCM) signals that are then converted to analog audio by the CODEC 20.

In the transmit mode, voice signals are received from a user at microphone 26, and processed at the volume control section 22. The CODEC 20 encodes processed microphone audio into PCM signals, and the transcoder 18 encodes the PCM signals into ADPCM signals for transmission by the transceiver 12.

The transceiver 12 includes a received signal strength indicator (RSSI) 15. The RSSI 15 is coupled to an Analog-to-Digital port on the micro-computer 16 for indicating the strength of received signals. The TDD 14 provides transmitter and receiver control signals to the transceiver 12 for causing the transceiver 12 to receive and transmit, for specified alternating periods in accordance with the CAI. Since the voice signals received by transceiver 12 are digitized, the handset 10 is subject to the above-discussed pops and noise bursts. According to the invention, the controller 16 predicts when the short pops and noise burst will occur by monitoring the RSSI line output from the radio transceiver 12. The TDD receiver control signal is provided to the controller 16 to indicate when to sample the RSSI output.

The RSSI signal indicates that a "pop" or "noise-burst" is likely to occur when RSSI is below a predetermined "mute-threshold." Thus, when the controller 16 detects that the RSSI signal drops below the mute-threshold, it quickly mutes the audio. The loss of synchronization is also predicted by keeping track of the length of time that the RSSI signal has been below the mute-threshold. Thus, the controller also acts as a timer to keep track of the length of time that the RSSI signal has been below the mute-threshold.

Figure 2:
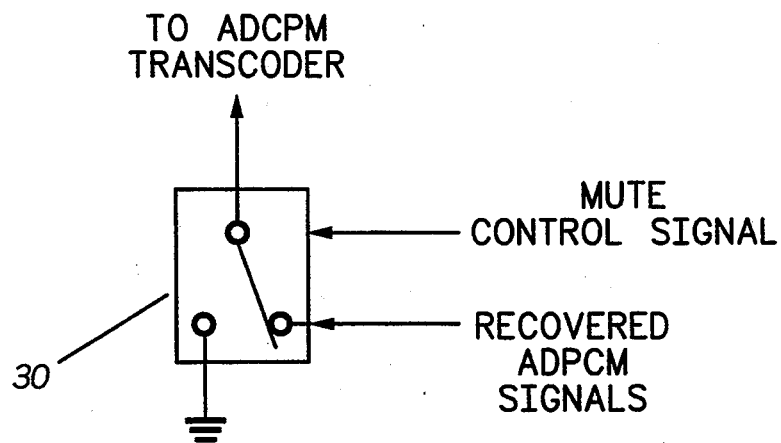
FIG. 2 shows switching of coded signals in accordance with the invention.

Referring to FIG. 2, a switch 30 represents the operation of the controller 16 in muting the audio of the handset 10. During normal operation, switch 30 is in position 1, in which the recovered ADCPM signals from transceiver 12 (via the controller 16) are applied to the transcoder 18. When the controller 16 determines that audio muting is required, a mute control signal is generated at the TDD 14, and applied to a switch 30 for placing the switch in a position 2. In position 2, the TDD 14 forces an "all zeroes" pattern (i.e., ground potential is applied) on the volume control 22 (possibly via the transcoder 18 and the CODEC 20), thus disabling the volume control 22 to mute the output audio at the speaker 24. Whenever the volume control 22 is enabled in the handset 10, the RSSI level is monitored once every 2 milliseconds.

Figure 3:
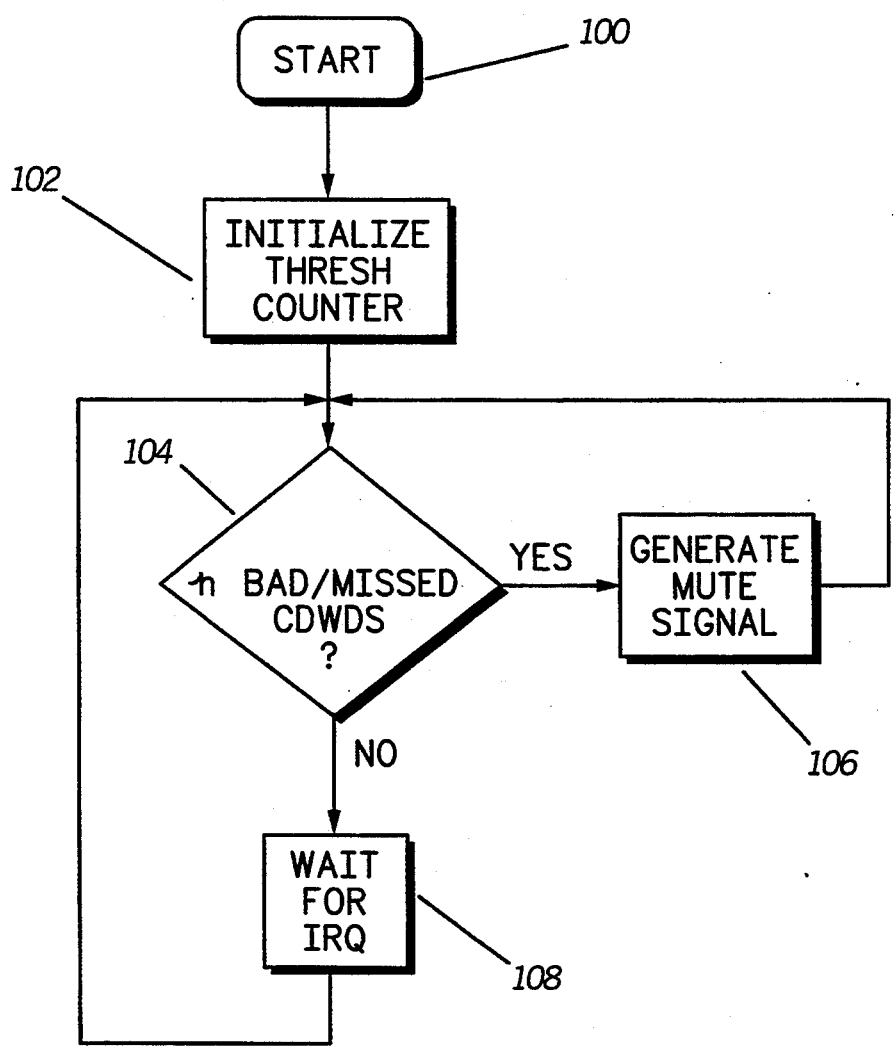
FIG. 3 is a flow chart of an audio muting method in accordance with the invention.

Referring to FIG. 3, there is shown an audio muting process, in accordance with the invention, for use in a CT2 communication system. CT2 transmissions include data packets called codewords which comprise 64 bits per frame. Codewords include error detection which indicates whether a transmitted information stream is valid. Each codeword contains a 15-bit cyclic redundancy check (CRC), and a one-bit parity check to determine whether the codeword is valid.

The process begins at step 100. In step 102 threshold counter means (within the controller 16) is initialized. The counter means is maintained to indicate the length of time that RSSI has been below the mute-threshold. Whenever the RSSI is below the "mute-threshold" level, the volume control 22 is muted immediately, and the counter means is decremented. In decision 104, the controller 16 determines whether a specified number (n) of codewords were missed (i.e., received incorrectly or not at all). The number, n, is determined in accordance with the desired audio quality. If decision 104 is affirmative, a noise burst is anticipated and a mute signal is generated (step 106). The process then returns to decision 104. If decision 104 is negative, the controller waits for an interrupt request (IRQ) signal (i.e., a signal generated every two milliseconds, in response to the receive control signal produced at the TDD 14), in step 108 and the process returns to decision 104.

Figure 4:
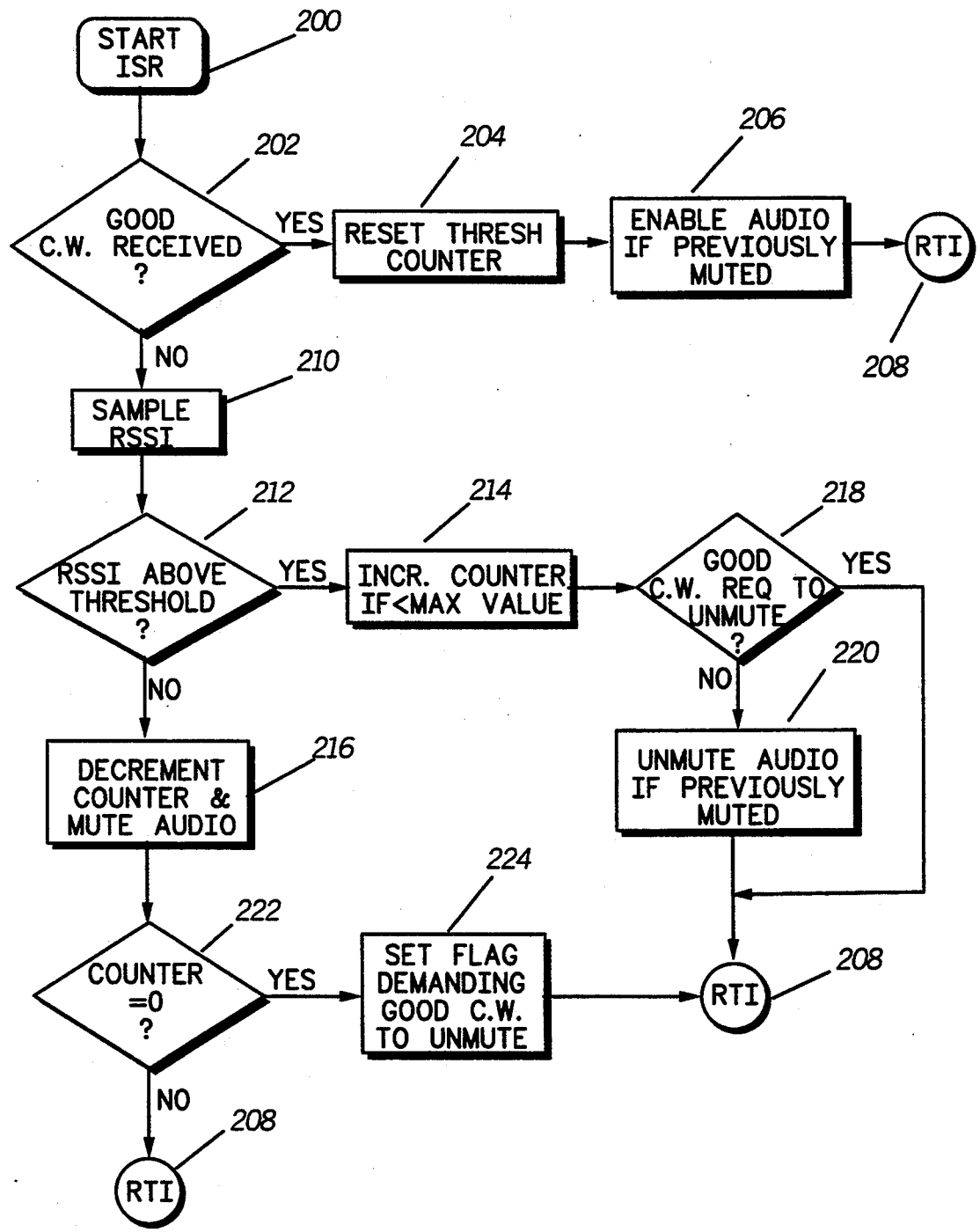
FIG. 4 is a flow chart of another audio muting method in accordance with the invention.

Referring to FIG. 4, there is shown an interrupt service routine (ISR) in accordance with the invention. In step 200 the interrupt service routine begins. In decision 202, it is determined whether a good (or valid) codeword is received during a CT2 multiplex scheme that indicates that frame synchronization is good. Several multiplexing schemes are used in CT2 communication systems depending on the mode of operation. If decision 202 is affirmative, a threshold counter is reset (step 204). Then if the audio was previously muted, it is enabled (step 206), and a return from interrupt service routine (RTI) executed by controller 16 (step 208). If decision 202 is negative, the RSSI output of the transceiver 12 is sampled (step 210). A further decision 212 is then made to determine whether the sampled RSSI level is above a predetermined threshold.

If decision 212 is affirmative and if the count is below a maximum value, the counter is incremented (step 214). A decision 218 is then made to determine whether a good codeword is required to unmute the audio. If decision 218 is affirmative, an RTI signal is sent to the controller 16 (step 208). If decision 218 is negative, and the audio was previously muted the audio is unmuted (step 220).

If decision 212 is negative, the counter has now been counted down to zero, and then a flag is set to indicate that the audio is to be unmuted only if a codeword is received (with a valid CRC and parity). Then when a good codeword is received, the counter is reinitialized and the audio is unmuted. Thus, the counter is never incremented above its initial value even if the RSSI signal stays above the mute-threshold. A decision 222 is then reached to determine whether the counter is at zero. If decision 222 is affirmative, a flag is set demanding a good codeword to unmute (step 224), and an RTI is executed by the controller 16 (step 208). If decision 222 is negative, an RTI is executed by the controller 16 (step 208).

Whenever the RSSI is above the threshold level and the counter indicates that synchronization has not been lost (i.e., the counter is non-zero), the audio circuitry is re-enabled. Thus the audio path may be muted on and off very fast (e.g., up to 250 times a second) as long as the counter is non-zero.

Whenever the RSSI is below the "mute-threshold" level the audio circuitry is muted immediately and the counter is decremented. After the RSSI has been below the mute threshold for a set amount of time, the audio circuit 22 is left muted until an indication is received that synchronization is still being maintained. In a CT2 system this is indicated by the reception of a good "codeword", a packet of cyclic redundancy checked (CRC) data. If a good codeword is received then the audio path is reenabled and the loss-of-synchronization timer is reset. When the audio circuit is muted, only the received audio is muted, not the transmitted audio because the other end might still be able to receive. If the counter is counted down to zero then a flag is set to indicate that the audio is to be unmuted only if a codeword is received (with a good CRC). Then when a good codeword is received the counter is reinitialized and the audio is unmuted. The counter is never incremented above its initial value even if the RSSI signal stays above the mute-threshold.

In the handset 10 the RSSI signal output by the radio receiver is applied into a Analog-to-Digital port on the microcomputer 16. Whenever the audio circuits 21 are enabled in the handset 10, the RSSI level is monitored once every 2 milliseconds. A counter 26 is maintained that indicates the length of time that RSSI has been below the mute-threshold.

The following pseudo code details an algorithm in accordance with the invention:

---

2 Millisecond monitor routine:
Read RSSI
If RSSI higher than Mute-Threshold Then
    If Counter not 0 Then
        If Counter < initial value Then
            Increment Counter
        Endif
        If muted-flag set Then
            Unmute Audio
            Clear Muted-flag
        End if
    Endif
Else
    If Count > 0 Then
        Decrement Count
    Endif
    If muted-flag not set Then
        Mute Audio
        Set Muted-flag
    Endif Code word received routine:
If codeword has good CRC Then
    If Muted-flag set Then
        Unmute Audio
        Clear Muted-flag
    Endif
    Set Count to initial value
Endif

---

Therefore, the foregoing method and apparatus avoids noise burst problems by muting of a radio-receiver audio in response to monitoring of received signal strength in accordance with the invention.

What is claimed is:

1. A digital radio communication device comprising:
receiver means for receiving radio signals, the radio signals comprising distal information;
a received signal strength indicator (RSSI) for producing an RSSI signal indicative of the level of the radio signals received by the radio receiver;
an audio section for producing output audio signals representing the radio signals received by the radio receiver:
attenuator means, coupled to the audio section, for attenuating the output audio signals whenever the RSSI indicates the received signal strength is below a predetermined threshold for predicting loss of synchronization of the communication device.

2. In a radio telephone unit providing audio output signals representing received radio signals, a method for muting the audio output signals comprising the steps of:

receiving the received radio signals, the radio signals having a received signal strength level and including a plurality of digital words;

determining whether a valid digital word is received, according to a first set of criteria;

sampling the received signal strength level;

determining whether the received signal strength level is below a predetermined threshold level;

muting the audio output signals when the received signal strength level is below the predetermined threshold level; and continuing to mute the audio output signals until a valid digital word is received.

3. The method of claim 2, further comprising the step of:

initiating a counter to determine the length of time that the received signal strength level is below the predetermined threshold for predicting loss of synchronization of the radio telephone unit.

4. In a radio telephone unit providing audio output signals representing received radio signals, a method for muting the audio output signals comprising the steps of:

receiving the received radio signals, the radio signals having received signal strength level and including a plurality of digital words;

determining whether a valid digital word is received, according to a first set of criteria;

sampling the received signal strength level;

determining whether the received signal strength level is below a predetermined threshold level;

muting the audio output signals when the received signal strength level is below the predetermined threshold level;

determining whether a predetermined number of digital words have been missed or received incorrectly; and muting the audio output signals when the predetermined number of digital words have been missed or received incorrectly.

5. The method of claim 4, further comprising the step of:

waiting for a signal generated by the radio telephone unit indicating that the received signal strength level is to be sampled until the predetermined number of digital words have been missed or received incorrectly, then muting the audio output signals.

6. In a radio telephone unit providing audio output signals representing received radio signals, the received radio signals include good codewords, a method for interrupting the audio output signals comprising the steps off (a) determining whether a good codeword is received;

(b) resetting a threshold counter when a good codeword is received;

(c) enabling the audio output signals, if the audio output signals were previously muted;

(d) sampling received signal strength level of the received radio signals when a good codeword is not received;

(e) determining whether the received signal strength level is above a threshold level;

(f) decrementing the threshold counter and muting the audio output signals when the received signal strength level is not above the threshold level;

(g) determining whether the threshold counter is at zero; and (h) requiring a good codeword be received in order to unmute the audio output signals when the threshold counter is at zero.

7. The method of claim 6 wherein step (e) comprises the further steps of:

determining whether a good codeword is required to unmute the audio output signals if the received signal strength level is above the threshold level; and unmuting the audio output signals if the audio output signals were previously muted and a good codeword is not required to unmute the audio output signals.

8. A method as defined in claim 7, wherein step (e) further comprises the step of:

incrementing the threshold counter if the threshold counter has not reached the value it has when it is reset.

* * * * *

UNITED STATES PATENT AND TRADEMARK OFFICE
CERTIFICATE OF CORRECTION

PATENT NO. : 5,408,693
DATED : April 18, 1995
INVENTOR(S) : Alton et al.

It is certified that error appears in the above-indentified patent and that said Letters Patent is hereby corrected as shown below:

Column 5

At the end of claim 1, before the period, please insert
--, and a counter for measuring the time that the RSSI level is below the predetermined threshold--.

Signed and Sealed this

Third Day of October, 1995

Attest:

BRUCE LEHMAN

*Attesting Officer*          *Commissioner of Patents and Trademarks*